(12) United States Patent
Welch et al.

(10) Patent No.: US 8,053,866 B2
(45) Date of Patent: Nov. 8, 2011

(54) VARACTOR STRUCTURES

(75) Inventors: Pamela J. Welch, Mesa, AZ (US); Wen Ling M. Huang, Scottsdale, AZ (US); David G. Morgan, Phoenix, AZ (US); Hernan A. Reuda, Phoenix, AZ (US); Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 163 days.

(21) Appl. No.: 12/536,715

(22) Filed: Aug. 6, 2009

(65) Prior Publication Data

US 2011/0031588 A1    Feb. 10, 2011

(51) Int. Cl.
*H01L 29/93* (2006.01)
*H01L 21/329* (2006.01)

(52) U.S. Cl. ......... 257/595; 257/E27.049; 257/E29.344; 257/E21.364; 327/586; 438/379

(58) Field of Classification Search .................. 327/586; 438/379
See application file for complete search history.

(56) References Cited

U.S. PATENT DOCUMENTS
7,025,615 B2   4/2006   Johansson et al.
7,084,485 B2   8/2006   Kirchgessner

OTHER PUBLICATIONS

Abadeer, W., et al., A Capacitance Reliability Degradation Mechanism in Hyper-Abrupt Junction Varactors, IEEE, 4244-2050 Jun. 2008 pp. 310-314.
Cao, C.,et al., Millimeter-Wave Voltage-Controlled Oscillators in 0.13-um CMOS Technology, IEEE Journal of Solid-State Circuits, vol. 41, No. 6, Jun. 2006 pp. 1297-1304.
Jenkins, K., et al., Characteristics of Submicron MOS Varactors, IEEE, 7803-9472, Feb. 2006, pp. 123-126.
Vytla, R., et al., Simultaneous Integration of SiGe High Speed Transistors and High Voltage Transistors, IEEE, 4244-0459, Jun. 2006.

*Primary Examiner* — Victor A Mandala
*Assistant Examiner* — Whitney T Moore
(74) *Attorney, Agent, or Firm* — Ingrassia, Fisher & Lorenz, PC (57) ABSTRACT

An improved varactor diode (20, 50) having first (45) and second (44) terminals is obtained by providing a substrate (22, 52) having a first surface (21, 51) in which are formed isolation regions (28, 58) separating first (23, 53) and second (25, 55) parts of the diode (20, 50). A varactor junction (40, 70) is formed in the first part (23, 53) and having a first side (35, 66) coupled to the first terminal (45) and a second side (34, 54) coupled to the second terminal (44) via a sub-isolation buried layer (SIBL) region (26, 56) extending under the bottom (886) and partly up the sides (885) of the isolation regions (28, 58) to a further doped region (30, 32; 60, 62) ohmically connected to the second terminal (44). The first part (36, 66) does not extend to the SIBL region (26, 56). The varactor junction (40, 70) desirably comprises a hyper-abrupt doped region (34, 54). The combination provides improved tuning ratio, operating frequency and breakdown voltage of the varactor diode (20, 50) while still providing adequate Q.

19 Claims, 5 Drawing Sheets

VARACTOR STRUCTURES

FIELD OF THE INVENTION

The present invention generally relates to semiconductor (SC) devices and integrated circuits (ICs) and, more particularly, structures and methods for variable capacitance semiconductor devices referred to as "varactors".

BACKGROUND OF THE INVENTION

Varactor diodes, typically but not always PN junction devices, are devices whose capacitance varies as a function of the applied reverse voltage. The change in varactor capacitance with applied voltage comes about because the depletion region of the reverse biased junction widens and narrows as the applied voltage is changed. This change in capacitance with applied voltage can be used to advantage to provide tuning and other functions where a voltage variable capacitance is useful. Varactor diodes are much used for this purpose.

However the usefulness of varactors depends upon a number of factors such as the breakdown voltage, the tuning ratio and the series resistance. If a sufficiently large reverse voltage is applied, the varactor will breakdown or fail in generally the same manner as any diode. Obviously, the maximum tuning voltage that can be applied is limited by the breakdown voltage. Hence, the breakdown voltage needs to be higher than the operating voltage. The tuning ratio ($TR=C_{jv=0}/C_{jv=V}$) is defined as the ratio of the capacitance $C_{jv}$ at one junction voltage, e.g., jv=0 volts, to the capacitance at another junction voltage, e.g., jv =V volts, and is a measure of the amount of capacitance variation that can be usefully obtained. For example, the higher the tuning ratio, the greater the tuning range of an oscillator where the varactor diode capacitance $C_{jv}$ is controlling the oscillator frequency. So, it is desirable that the tuning ratio (TR) be large. Further, even though the varactor is DC reverse biased and little or no significant DC current flows, it is still carrying AC current so the series resistance contributes to AC losses. Hence, the series resistance of the varactor diode is important since it affects the quality factor (Q) of the varactor as a tuning element. In general, the higher the series resistance, the lower the Q.

It is usually the case with present day varactors that changing the device design or construction to improve one or more of the breakdown voltage, tuning ratio, or series resistance can adversely affect the others. Thus, a need continues to exist for improved varactor structures and methods wherein one or more of these factors can be improved simultaneously without significant adverse effect on other varactor properties.

BRIEF DESCRIPTION OF THE DRAWINGS

The present invention will hereinafter be described in conjunction with the following drawing figures, wherein like numerals denote like elements, and wherein:

FIGS. 1-2 are simplified schematic cross-sectional views through varactor diodes according to embodiments of the invention, wherein FIG. 1 illustrates a single ended varactor diode and FIG. 2 illustrates a differential varactor diode;

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation or fabrication in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

As used herein, the term "semiconductor" is intended to include any semiconductor whether single crystal, poly-crystalline or amorphous and including type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures, semiconductor-on-insulator (SOI) structures, and combinations thereof. The term "semiconductor" is abbreviated as "SC."

For convenience of explanation and not intended to be limiting, the semiconductor devices and methods of fabrication are described herein for silicon semiconductors but persons of skill in the art will understand that other semiconductor materials can also be used. Further, even though the present invention is illustrated for the case of a PN junction varactor diode, those of skill in the art will understand that the embodiments also include any type of rectifying device providing a voltage variable capacitance and whose depletion width depends upon the doping of the semiconductor and the applied voltage. Non limiting examples are PN junction diodes, metal-semiconductor diodes and hetero-junction diodes. As used herein the term "metal" is intended to include semi-metals, semiconductor-metal alloys and other materials that are relatively more conductive than the associated semiconductor body or regions.

The various embodiments of the invention described here are illustrated by semiconductor devices and structures of particular conductivity type having various P and N doped regions appropriate for that conductivity type device or structure. But this is merely for convenience of explanation and not intended to be limiting. Persons of skill in the art will understand that devices or structures of opposite conductivity type may be provided by interchanging conductivity types so that a P-type region becomes an N-type region and vice versa. Alternatively, the particular regions illustrated in what follows may be more generally referred to as of a "first conductivity type" and a "second, opposite conductivity type", where the first conductivity type may be either N or P type and the second opposite conductivity type is then either P or N type, and so forth.

Figure 1:
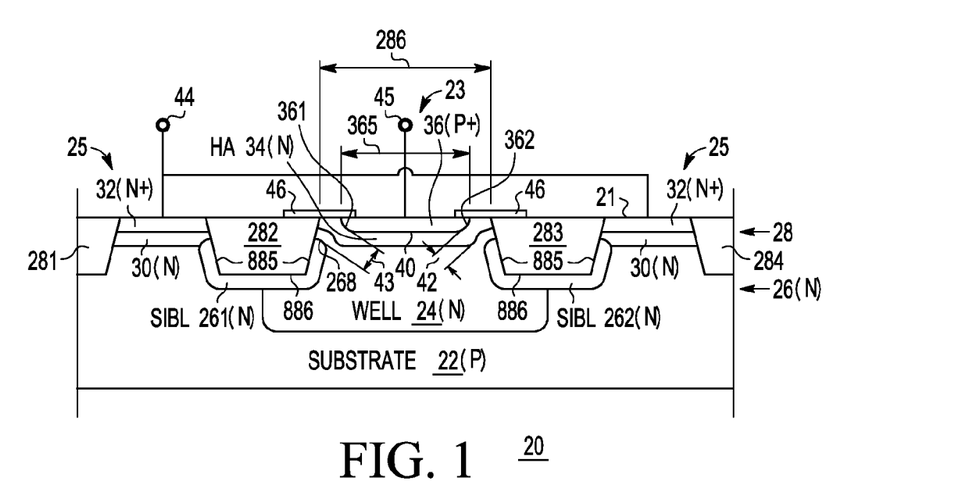
Figure 2:
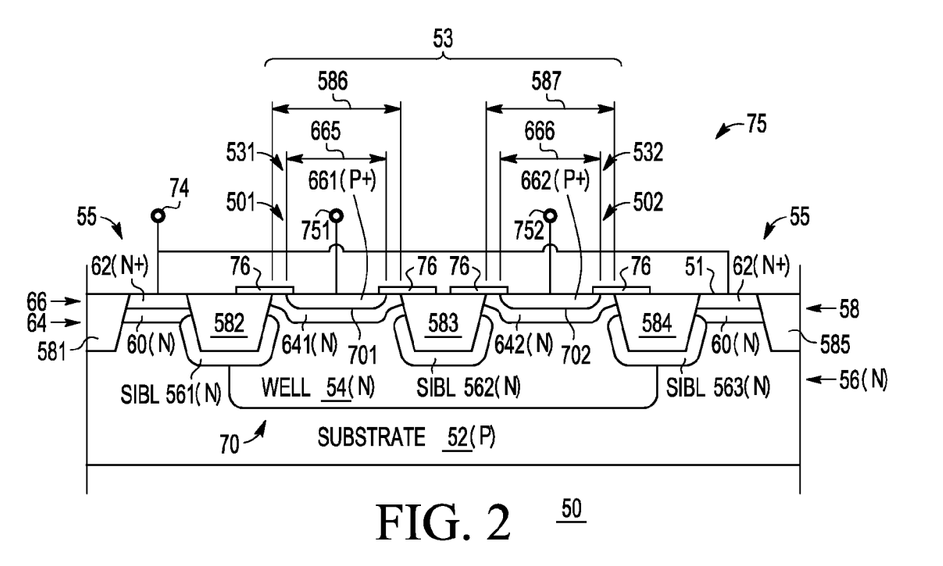

FIGS. 1-2 are simplified schematic cross-sectional views through varactor diodes 20, 50 according to embodiments of the invention, wherein FIG. 1 illustrates single ended varactor diode or device 20 and FIG. 2 illustrates differential varactor diode or device 50. Because they have many aspects in common, they are initially discussed together. Varactor diode or device 20, 50 comprises substrate 22, 52 having upper surface 21, 51. Substrate 22, 52 may comprise any of the semiconductor materials and forms mentioned above as well as others. For convenience of illustration, it is presumed hereafter to be a silicon substrate, but this is not intended to be limiting and any semiconductor (SC) material in any configuration (e.g., monolithic, layered, polycrystalline, etc.) may be used. Devices 20, 50 are further illustrated in the text and drawings as comprising various N and P layers or regions, such as for example, 22(P), 24(N), 261(N) and 262(N) collectively 26(N), 30(N), 32(N+), 34(N), 36(P+), etc., in FIG. 1 and 52(P), 54(N), 561(N)-563(N) collectively 56(N), 60(N), 62(N+) 641(N) and 642(N) collectively 64(N), 661(P+) and 662(P+) collectively 66(P+), etc., in FIG. 2 The parenthetic designations as (N) or (P) type conductivity are merely for convenience of explanation and by way of illustration of various embodiments and not intended to be limiting. The inclusion of (+), as for example in (P+) or (N+), indicates that such regions are more heavily doped than regions lacking such designation. Persons of skill in the art will understand that devices of opposite conductivity type are constructed by interchanging the doping types of the various exemplary N and P regions and, as noted above, such regions may be more broadly referred to as being of a first conductivity type (which may be either N or P) or being of a second, opposite, conductivity type which is then either P or N. Devices 20, 50 may be substantially laterally surrounded by dielectric isolation regions, but these may be omitted in other embodiments, and are not shown in the drawings other than exemplary shallow trench isolation (STI) regions 281, 284; 581, 585 at the extreme left and right ends of FIGS. 1-2 and FIGS. 7-13. Shallow trench isolation (STI) regions 281-284 and 581-585 are referred to collectively as STI regions 28, 58, respectively, and have lateral sidewall surfaces 885 and bottom surfaces 886 where they intersect SC substrate 22(P). STI regions 282-283 of FIG. 1 are separated by distance 286 at surface 21. In FIG. 2, STI regions 582-583 are separated by distanced 586 and STI regions 583-584 are separate by distance 587 at surface 51. Various surface dielectric layers that are customarily provided for surface passivation, implant screening or interlayer insulation or isolation are omitted in FIGS. 1-2 and other figures to avoid cluttering the drawings and obscuring the invention. Doped regions 30(N), 60(N); 32(N+), 62(N+) and STI regions 282, 283 and 582, 584 in the left and right halves of FIGS. 1-2, respectively, may be annular shaped, in some embodiments, and therefore internally connected. Such internal connections so not show in the cross-sectional views of FIGS. 1-2. In other embodiments, doped regions 30(N), 60(N); 32(N+), 62(N+) and STI regions 282, 283 and 582, 584 in the left and right halves of FIGS. 1-2, respectively, may be separate and for doped regions 30(N), 60(N); 32(N+), 62(N+) externally connected as for example, by conductors overlying surface 21, 51. In still further embodiments, some or all of the various regions or layers illustrated in FIGS. 1-2 may terminate at dielectric isolation regions (not shown) lying substantially parallel to and behind and/or before the planes of FIGS. 1-2. Any of these arrangements is useful.

Substrate 22(P), 52(P) comprises shallow trench isolation (STI) regions 28, 58 extending to surface 21, 51. STI regions 28, 58 typically comprise insulating dielectric such as silicon oxide, but other dielectrics may also be used. In FIG. 1, well region 24(N) is provided underlying and extending substantially between STI regions 282 and 283 under central portion 23 of device 20. In FIG. 2, well region 54(N) is provided underlying and extending substantially between STI regions 582, 583 and 584 under central portions 531, 532 (collectively 53) of device 50. Sub-isolation buried layer (SIBL) regions 261(N), 262(N) are provided underlying STI regions 282, 283 respectively, and SIBL regions 561(N), 562(N), 563(N) are provided underlying STI regions 582, 583, 584 respectively. In further embodiments, SIBL regions (not shown) may also be provided under STI regions 281, 284 and 581, 585. Either arrangement may be used. In portions 25 between STI regions 281-282 and between STI regions 283-284 and in portions 55 between STI regions 581-582 and between STI regions 584-585, there are provided doped regions 30(N), 60(N) with contact regions 32(N+), 62(N+), respectively, ohmically coupled to adjacent SIBL regions 261(N), 262(N) and 561(N), 563(N) respectively.

Doped region 34(N) is located in central portion 23 of device 20 of FIG. 1 between STI regions 282-283 in well region 24(N). Region (34N) is desirably a hyper-abrupt (HA) doped region (see FIG. 3), and is henceforth referred to as HA region 34(N). As is more fully explained later, it is desirable in some embodiments that thickness 42 of HA region 34(N) in well 24(N) be sufficient to withstand the rated breakdown voltage. Located within HA region 34(N) is further doped region 36(P+) forming varactor junction 40. To minimize instability, it is desirable in some embodiments that lateral edges 361, 362 of region 36(P+) not extend to adjacent STI regions 282, 283. PN junction 40 formed between region 36(P+) and HA region 34(N) is the active junction of device 20. As is explained more fully in connection with FIG. 3, as junction 40 is reverse biased, HA region 34(N) becomes depleted of free carriers and supports the applied voltage. The greater the applied voltage, the wider the depletion region and the lower the AC capacitance of device 20. It is this widening (and narrowing) of the depletion region in response to changes in the applied ~DC voltage that provides the desirable variable capacitance associated with varactor diode 20 and allows it to be used, for example as a very compact and stable tuning element in integrated circuits (ICs). When the depletion region expands to contact lateral edge 268 of SIBL region 26(N), breakdown can occur. Thus, it is desirable in some embodiments that separation 43 through HA region 34(N) between junction 40 and lateral edge 268 of SIBL region 26(N) be sufficiently large to support the rated reverse voltage of varactor diode or device 20. The separation of the junction 40 from the STI edge can also improve the varactor capacitance stability over time. It is further desirable in some embodiments that separation 43 not be excessive, since this would increase the AC series resistance of varactor diode 20, thereby undesirably lowering its quality factor (Q). Accordingly, it is desirable in some embodiments that separation 43 be comparable to the depletion width at the highest desired reverse voltage. Regions 32(N+) are coupled to terminal 44 and region (36(P+)) is coupled to terminal 45, thereby providing terminals 44, 45 of varactor diode 20. As is explained more fully in connection with FIGS. 4-13, mask regions 46 on surface 21 are conveniently used in determining the lateral extent of HA region 34(N) and region 36(P+) and spacings 42, 43.

Device 50 of FIG. 2 differs from device 20 of FIG. 1 in that device 50 contains two varactor diodes 501, 502 in portions 531, 532 (collectively 53) that can be used in a differential mode. Regions 52(P), 54(N), 56(N), 58, 60(N), 62(N+), 64(N), 66(P+), etc., in FIG. 2 are generally analogous to regions 22(P), 24(N), 26(N), 28, 30(N), 32(N+), 34(N), 36(P+), etc., of FIG. 1 and the discussion thereof in connection with FIG. 1 is generally applicable to the analogous regions of FIG. 2. Device 50 of FIG. 2 has HA regions 641(N), 642(N) collectively 64(N), and diode forming regions 661(P+), 662(P+) collectively 66, separated by STI region 583 with underlying SIBL region 562(N). SIBL region 562(N) is ohmically coupled to SIBL regions 561(N) and 563(N) via well 54(N), and in other embodiments may or may not have a further conductive interconnection overlying surface 51. Although not explicitly shown in FIG. 2, the same conditions apply to the equivalent of distances 42, 43 shown in FIG. 1 with respect to each of varactor diodes 501, 502 in portions 531, 532 and the discussion of distances 42, 43 is correspondingly relevant to devices 501, 502. Regions 62(N+) are coupled to terminal 74. Region 661(P+) is coupled to terminal 751 and region 662(P+) is coupled to terminal 752. Differential action is obtained by driving terminals 751 and 752 with AC signals having 180° phase difference. Differential layout results in improved Q, less silicon area, and reduced common-mode noise.

Figure 3:
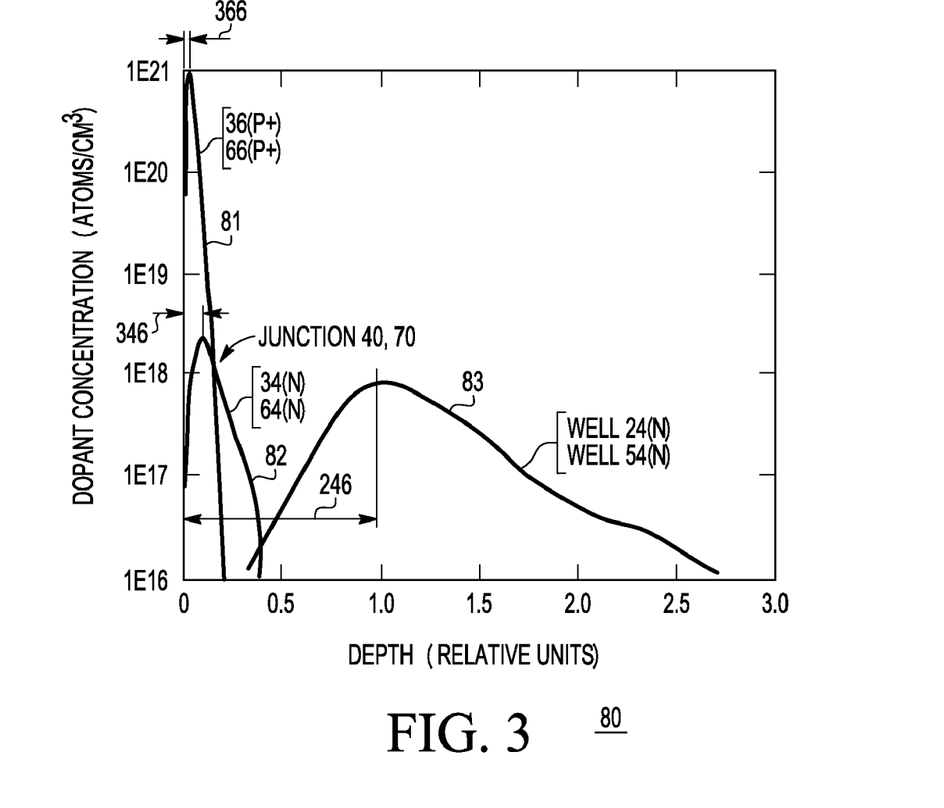
FIG. 3 shows a simplified schematic plot of doping concentration versus depth for active regions of the varactor diodes of FIGS. 1-2, according to a preferred embodiment of the invention.

FIG. 3 shows simplified schematic plot 80 of doping concentration versus relative depth from surface 21, 51 through active portions 23 and 531, 532 of varactor diodes 20, 50 of FIGS. 1-2, according to a preferred embodiment of the invention. The depth scale on the abscissa is shown in relative units wherein depth 246 of the peak doping of well region 24(N), 54(N) is set at unity. Trace 81 shows the doping profile of region 36(P+) and regions 661(P+), 662(P+) (collectively 66(P+)). Trace 82 shows the doping profile of HA region 34(P) and regions 641(N) and 642(N) (collectively 64(N)). Junctions 40 and 701, 702 (collectively 70) occur where traces 81 and 82 intersect. Trace 83 shows the relative depth doping profile of WELL regions 24(N) and 54(N). Regions 34(N) and 64(N) are referred to as being hyper-abrupt (HA) because the doping concentration in this region is reduced moving to the right away from the junction 40, 70. Such doping profile enables increased response in the varactor capacitance with applied reverse voltage. Use of such hyperabrupt doping profile is preferred to obtain optimum varactor linearity but, in other embodiments, other doping profiles may also be used. Either arrangement is useful.

It was found that by constructing varactor diode 20, 50 as described above and further described in connection with FIGS. 4-13, that overall improved properties were obtained with minimum adverse impact on other properties. These results are summarized in Table I below, where the device of FIGS. 1-3 (and 4-13) is compared to a prior art device of substantially the same overall area. The tuning ratio, breakdown voltage and oscillator frequency tuning range are all improved while still maintaining an adequate although somewhat smaller Q.

TABLE I

VARACTOR DIODE PERFORMANCE COMPARISON

| Device Type | Tuning Ratio | Q at 77 GHz | Breakdown Voltage at 1 µA/µm | Oscillator tuning range in GHz |
|---|---|---|---|---|
| Prior Art Device | 1.4 | 7.5 | ~6.0 volts | 3.30 |
| Device 20, 50 | 2.2 | 5.0 | ~6.5 volts | 7.25 |

FIGS. 4-13 are simplified cross-sectional views of varactor diodes 20, 50 of the type illustrated in FIGS. 1-3 at different stages 104-113 of manufacture showing corresponding structures 204-213, according to further embodiments of the present invention. In FIGS. 4-13, manufacture of a varactor diode corresponding to diode 20 of FIGS. 1 and 3 is particularly illustrated. However, those of skill in the art will understand that the same manufacturing sequence also applies to double diode device 50 of FIG. 2 with appropriate modification of the openings in the various masks to provide two active regions 501, 502. Based on the description herein, such modification is within the competence of those of skill in the art.

Figure 4:
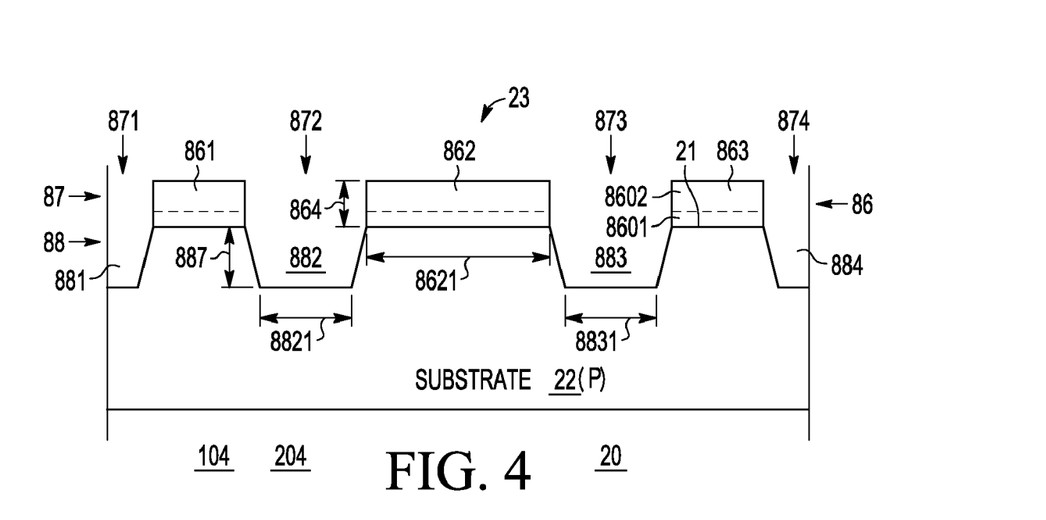
FIGS. 4-13 are simplified cross-sectional views of a varactor diode of the type illustrated in FIGS. 1-2 at different stages of manufacture according to further embodiments of the present invention.

Referring now to manufacturing stage 104 of FIG. 4, substrate 22 having upper surface 21 is provided. Substrate 22 may be any type of substrate either monolithic semiconductor or a layered structure with a semiconductor region thereon such as for example and not intended to be limiting an SOI structure, wherein the semiconductor is single crystal or amorphous or polycrystalline or a combination thereof and of any type of semiconductor material. In a preferred embodiment, a P type substrate of about 10 to 1000 ohm-cm resistivity silicon is suitable. Mask 86 of thickness 864 is applied and patterned to have closed portions 861, 862, 863 and openings 871, 872, 873, 874 collectively 87, in this example. In a preferred embodiment, mask 86 comprises: (i) relatively thin pad dielectric layer 8601 (e.g., silicon oxide) against semiconductor surface 21, chosen for its compatibility with semiconductor surface 21, and (ii) relatively thicker etch resistant layer (e.g., silicon nitride) 8602 chosen for its ability to resist the chemical reactions needed to etch trenches or cavities 881, 882, 883, 884 (collectively 88), into substrate 22. Thickness 864 is desirably large enough to act as a blocking mask during subsequent formation of SIBL regions 26(N) underlying cavities or trenches 882, 883 of device 20 and analogous regions of device 50.

Using openings 87, exposed regions of surface 21 of substrate 22 are etched, as for example, by reactive ion etching, to form cavity or trench 881 under mask opening 871, cavity or trench 882 under mask opening 872, cavity or trench 883 under mask opening 873, and cavity or trench 884 under mask opening 874, whereby collectively cavities or trenches 88 are formed under openings 87 to depths 887. In the illustration of FIG. 4, all of cavities or trenches 88 are shown as having the same depth 887. In other embodiments, some or all of individual cavities or trenches 881-884 may have different depths. Either arrangement is useful. Depth 887 is preferably about 0.3 to 0.5 micrometers, but larger or smaller depths may also be used. By way of example and not intended to be limiting, cavities 882, 883 (which will be filled with dielectric to provide STI regions 282, 283 in finished device 20, 50) can have widths 8821, 8831 as small as allowed by the technology design rules, preferably about 0.4 to 0.8 micrometer, but larger or smaller widths may also be used. While it is preferred that cavities 882, 883 have comparable widths, in other embodiments, their widths may be different. Width 8621 under mask portion 862, which corresponds approximately to the width of central portion 23 of finished device 20, is usefully in the range of about 0.5 to 4 micrometers, more conveniently about 1 to 3 micrometers and preferably about 1 to 2 micrometers, but larger or smaller widths may also be used. Structure 204 results.

Figure 5:
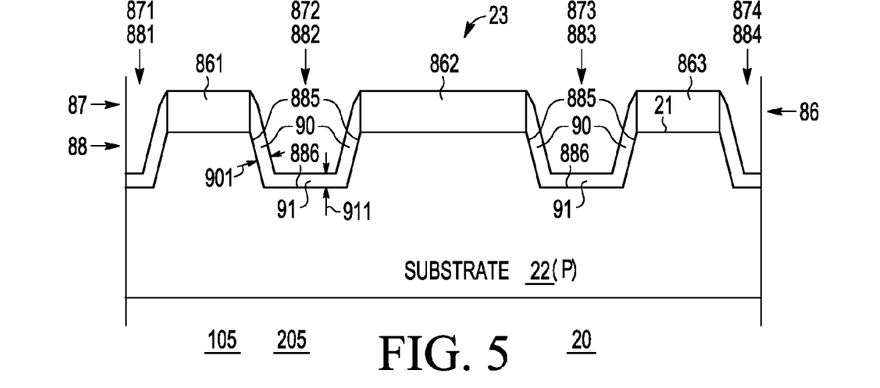

Referring now to manufacturing stage 105 of FIG. 5, in a preferred embodiment liners 90, 91 are formed in cavities 88. Dielectrics comprising for example, and not intended to be limiting, silicon oxide, silicon nitride or combinations thereof are useful for liners 90, 91, but other materials may also be used. Sidewall liner 90 formed on cavity or trench sidewalls 885 has thickness 901 preferably about 50 to 150 nanometers, but thicker or thinner layers may also be used. Bottom liner 91 formed on cavity or trench bottoms 886 has thickness 911 preferably about 30 to 70 nanometers, but thicker or thinner layers may also be used. A function of sidewall liner 90 is to control the amount and location of dopant implanted in subsequent manufacturing stage 106 of FIG. 6 adjacent sidewalls 885 of trenches or cavities 88. A function of bottom liner 91 is to minimize the surface damage of semiconductor bottoms 886 of cavities 88 during the implant carried out in subsequent manufacturing stage 106. Liners 90, 91 may be of the same or different materials and/or the same or different thicknesses in various embodiments. Structure 205 results.

Figure 6:
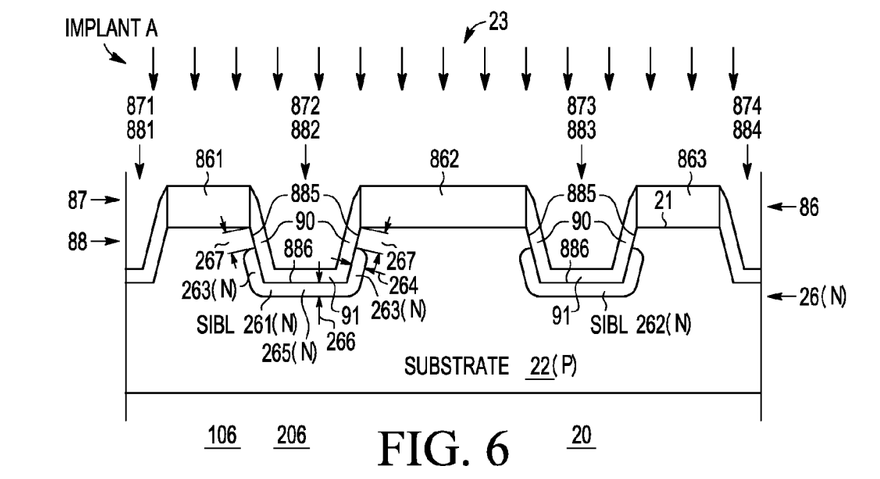

Referring now to manufacturing stage 106 of FIG. 6, Implant A is provided through openings 872, 873 so as to form sub-isolation buried layer (SIBL) regions 261(N) and 262(N), collectively 26(N) in cavities or trenches 882, 883. SIBL regions 26(N) have sidewall portions 263(N) of thickness 264 and bottom portions 265(N) of thickness 266. Where SIBL regions 26 are intended to be N type, arsenic is a suitable dopant. Sidewall portions 263(N) of SIBL regions 26(N) are separated from surface 21 of substrate 22 by distance 267 as a consequence of mask regions 861, 862, 863 of thickness 864 (see FIG. 4) still in place. In order to avoid unduly cluttering the drawing, some of the foregoing reference numbers may only be indicated in connection with STI region 282 in FIG. 6 and following, but it should be understood that they also apply to liners 90, 91 and SIBL region 262(N) associated with STI region 283 and any other STI regions 28 and SIBL regions 26(N) being formed, as for example, in connection with device 50 of FIG. 2. In a preferred embodiment, SIBL regions 26(N) have a substantially uniform doping usefully in the range of about 1E18 to 5E20 atoms/cm$^3$, more conveniently in the range of about 1E19 to 3E20 atoms/cm$^3$, and preferably about 2E20 atoms/cm$^3$, but higher or lower concentrations can also be used. Depth 266 is usefully in the range of about 0.2 to 1 micrometers, more conveniently of about 0.4 to 0.8 micrometers and preferably of about 0.6-0.7 micrometers below trench bottom 886, but larger or smaller values can also be used. Separation 267 may be controlled, for example by adjusting mask thickness 864 (see FIG. 4), depending upon the desired depth of HA region 34(N) and region 36(P+) to be subsequently formed (e.g., see FIGS. 10 and 12). This allows one to adjust and maintain separations 42, 43 (see FIGS. 1-2) in a desired range, as has already been discussed. By way of example, and not intended to be limiting, separation 267 is preferably in the range of about 50 to 100 percent of depth 363 of P+region 36(P+) (see FIGS. 1-2) but larger or smaller values can also be used. Structure 206 results.

Figure 7:
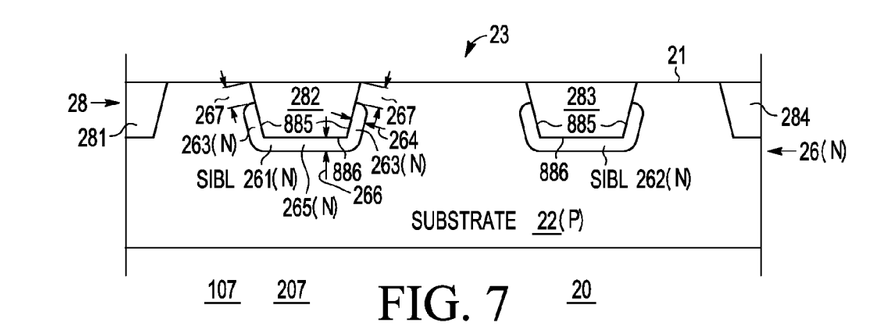

Referring now to manufacturing stage 107 of FIG. 7, the remaining portions of mask 86 and liners 90, 91 are removed, cavities 88 filled with dielectric and the combination planarized so as to leave shallow trench isolation (STI) regions 281, 282, 283, 284 (collectively 28) in trenches or cavities 881, 882, 883, 884 (collectively 88), respectively, with upper surfaces substantially co-planar with SC surface 21. Chemical-mechanical polishing is a suitable well known planarization technique. Silicon oxide, silicon nitride and combinations thereof are non-limiting examples of suitable dielectrics for use in STI regions 28, although other dielectric materials, organic and inorganic or combinations thereof may also be used. Structure 207 results.

Figure 8:
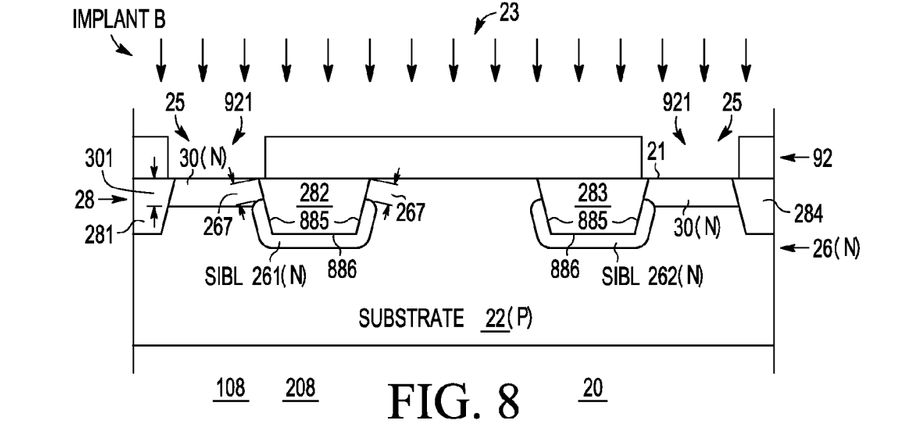

Referring now to manufacturing stage 108 of FIG. 8, mask 92 is provided on surface 21 with openings 921 above portions 25 lying between STI regions 281, 282 and 283, 284. Implant B of, for example, phosphorous, is provided through openings 921 into substrate 22(P) to depth 301 at least substantially equal to separation 267 so as to form regions 30(N) in ohmic contact with SIBL region 261(N) at the left side of STI region 282 and with SIBL region 262(N) at the right side of STI region 283. The purpose of regions 30(N) is to reduce the series resistance associated with varactor diode 20, 50. Regions 30(N) should have a doping concentration preferably about 1E19 to 1E20 atoms/cm$^3$, but higher or lower concentrations can also be used. Structure 208 results.

Figure 9:
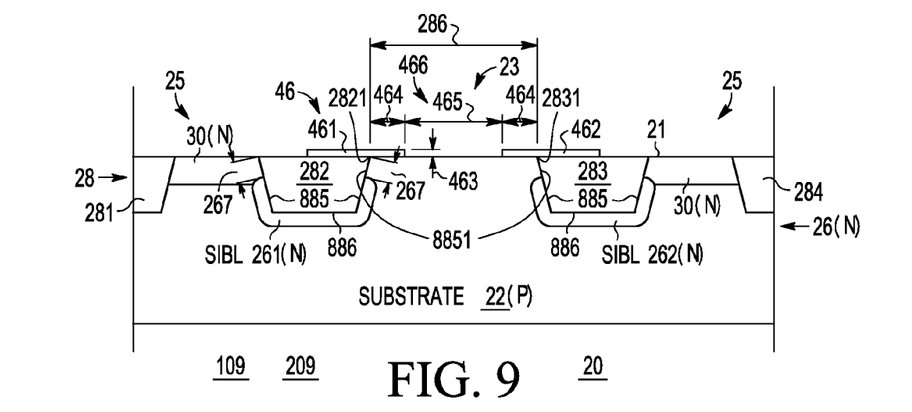

Referring now to manufacturing stage 109 of FIG. 9, mask 92 is removed and mask 46 is applied to surface 21 and over STI regions 28, and patterned to provide portions 461, 462 that extend from STI regions 282, 283 onto central portion 23 by distance 464 from inward edges 2821, 2831 at surface 21 of centrally facing sidewalls 8851 of STI regions 282, 283. Opening 466 of mask 46 has width 465. Mask 46 is preferably formed of silicon oxide, silicon nitride or a combination thereof. By way of example, and not intended to be limiting, mask 46 preferably comprises about 30 nanometers of silicon oxide plus about 70 nanometers of silicon nitride, but larger or smaller amounts and other materials may also be used. The purpose of mask 46 is to define the lateral extent (e.g., width 465) of the relatively low energy implant subsequently used to form regions 36(P+) in a further manufacturing step (e.g., see FIG. 12), thereby providing control over lateral extent 365 of regions 36(P+) so as to achieve the desired separation 42, 43 with respect to associated STI regions 28 and SIBL regions 26(N), as has been discussed earlier in connection with FIGS. 1-2. By adjusting lateral overhang distance 464 as well as the implant depth, subsequently formed regions 36(P+) can be arranged to not intersect STI regions 283, 284 and not intersect SIBL regions 261(N), 262(N), thereby maintaining separations 42, 43 previously discussed (see FIGS. 1 and 12). Structure 209 results.

Figure 10:
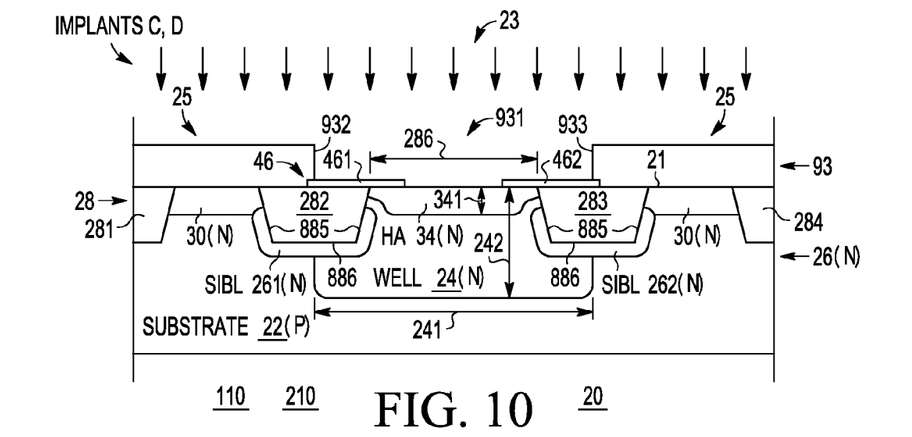

Referring now to manufacturing stage 110 of FIG. 10, mask 93 is provided over surface 21 and STI regions 28 so as to have opening 931 encompassing central portion 23 of width 286 (see FIG. 9) between STI regions 282, 283. Lateral edges 932, 933 of opening 931 determine lateral extent 241 of well 24(N) and, as shown in FIG. 10, are preferably located approximately centrally over STI regions 282, 283, but other locations may also be used. For example, and not intended to be limiting, lateral extent 241 should be sufficient to at least include some portions of SIBL regions 261(N) and 262(N), but may extend to or beyond portions 25 at the left and right of device 20 underneath regions 30(N). Any such arrangement is useful.

Implants C and D may be provided in either order. Implant C through opening 931 in mask 93 provides HA region 34(N) of depth 341 in central portion 23, for example, having a dopant concentration corresponding to trace 82 of FIG. 3. Arsenic is a suitable dopant for Implant C. More generally, the peak doping concentration of HA region 34(N) is usefully in the range of about 1E18 to 1E19 atoms/cm$^3$, more conveniently in the range of about 1E18 to 7E18 atoms/cm$^3$, and preferably about 2E18 to 4E18 atoms/cm$^3$, but higher or lower concentrations can also be used. The implant energy is desirably adjusted during implantation so as to achieve the desired doping profile, an example of which is provided in FIG. 3. Depth 341 is usefully in the range of about 0.2 to 0.6 micrometers, more conveniently about 0.3 to 0.5 micrometers and preferably about 0.4 to 0.5 micrometers, but larger or smaller values can also be used.

Implant D through opening 931 in mask 93 provides WELL region 24(N) of lateral extent 241 and depth 242 in central portion 23, for example, having a dopant concentration corresponding to trace 83 of FIG. 3. Phosphorous is a suitable dopant for Implant D. More generally, the peak doping concentration is preferably about 1E18 to 3E18 atoms/$cm^3$, but higher or lower concentrations can also be used. The peak doping concentration of Implant D is located beneath surface 21 at a depth preferably of about 0.9 to 1.1 micrometers, but larger or smaller values can also be used. Structure 210 results.

Figure 11:
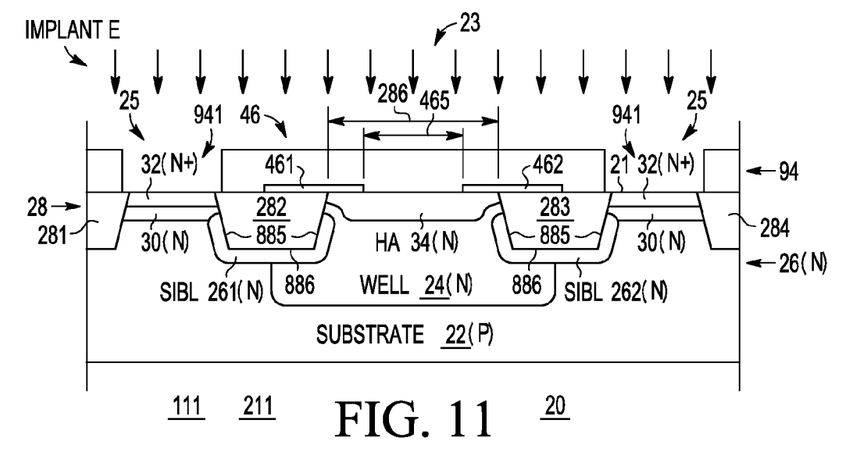

Referring now to manufacturing stage 111 of FIG. 11, mask 93 is removed and mask 94 applied having openings 941 over portions 25 between STI regions 281, 282 and between STI regions 283, 284. Central portion 23 between STI regions 282, 283 is covered. Implant E is provided to form relatively shallow highly doped contact regions 32(N+) in regions 30(N) extending to SC surface 21. Arsenic is a suitable impurity with dopant concentrations in regions 32(N+) preferably about 1E20 to 1E21 atoms/$cm^3$, but higher or lower concentrations and other impurities can also be used. Structure 211 results.

Figure 12:
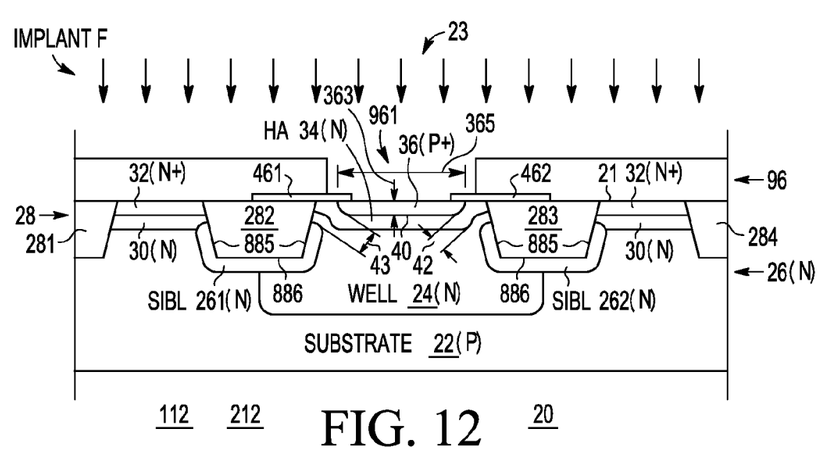
Figure 13:
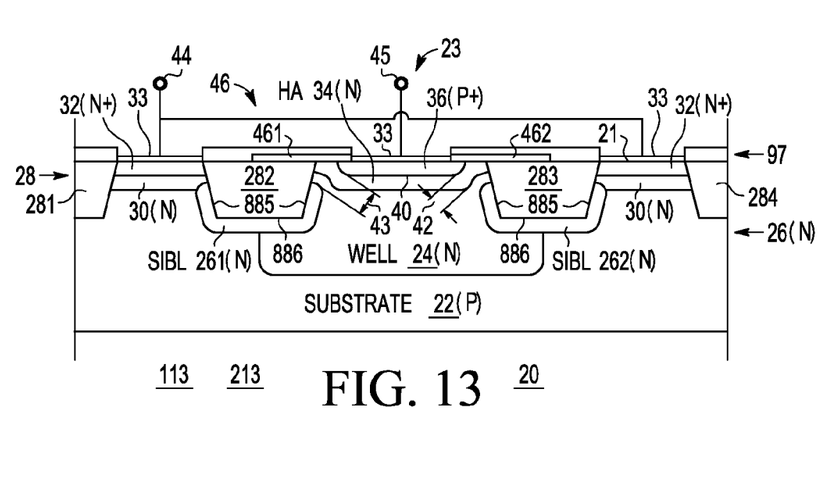

Referring now to manufacturing stage 112 of FIG. 12, mask 94 is removed and mask 96 applied having opening 961 over portion 23 between STI regions 282, 283. Portions 25 are covered. Implant F is provided to form relatively shallow highly doped contact region 36(P+) of depth 363 in HA region 34(N) extending to SC surface 21, thereby forming varactor junction 40. Boron is a suitable impurity with implant dose in regions 36(P+) usefully in the range of about 1E15 to 5E15 atoms/$cm^2$, more conveniently in the range of about 2E15 to 4E15 atoms/$cm^2$, and preferably about 3.5E15 atoms/$cm^2$ (e.g., see also FIG. 3), but higher or lower doses and other impurities can also be used. Depth 363 is used in part to further adjust separations 42, 43 and is usefully in the range of about 0.1 to 0.25 micrometers, more conveniently about 0.1 to 0.2 micrometers and preferably about 0.15 to 0.18 micrometers, but larger or smaller values can also be used. Structure 212 results. Referring now to manufacturing stage 113 of FIG. 13, standard back-end processing well known in the art is applied to structure 212 to provide conductive contacts 33 (e.g., one or more silicides) on doped regions 32(N+) and 36(P+), surface passivation layer(s) 97 and whatever single or multi-layer interconnects are desired to couple regions 32(N+) to terminal 44 and region 36(P+) to terminal 45. Device 20 is essentially complete.

According to a first embodiment, there is provided a varactor diode (20, 50) having first (45) and second (44) terminals, comprising, a substrate (22, 52) having a first surface (21, 51) and having a first portion (23, 53) and second portion (25, 55), one or more isolation regions (28, 58) at the first surface (21, 51) separating the first portion (23, 53) and the second portion (25, 55) and having lateral sidewalls (885) and a bottom (886), a rectifying junction (40, 70) located in the first portion (23, 53), comprising a first doped region (36, 66) of a first conductivity type extending to the first surface (21, 51) and coupled to the first terminal (45), and a second doped region (34, 64; 24, 54) of a second, opposite, conductivity type underlying the first portion (23, 53), wherein the rectifying junction (40, 70) does not extend to the one or more isolation regions (28, 58), a third doped region (30, 32; 60, 62) of the second conductivity type extending to the first surface (21), located in the second portion (25) and coupled to the second terminal (44), and one or more sub-isolation buried layer (SIBL) regions (26, 56) of the second conductivity type underlying the bottom (886) and extending part way up the lateral sidewalls (885) of the isolation regions (28, 58), and ohmically coupling the second (34, 64; 24, 54) and the third (30, 32; 60, 62) doped regions without intersecting the first doped region (36, 66). According to a further embodiment, the first doped region (36) is separated from the SIBL regions (26, 56) by a distance (43) exceeding a depletion width of the rectifying junction (40, 70) at maximum rated voltage. According to a still further embodiment, the diode (20, 50) further comprises a WELL region (24, 54) of the second conductivity type underlying the first portion (23, 53). According to a yet further embodiment, the WELL region (24, 54) intersects the one or more SIBL regions (26, 56). According to a still yet further embodiment, the diode (20, 50) comprises a mask (46, 76) on the first surface (21, 51) extending laterally by a first distance (464) onto the central portion (23, 53) from the one or more isolation regions (28, 58) and having an opening of a first width (465) determining at least in part a lateral width (365) of the first doped region. According to a yet still further embodiment, the one or more isolation regions (28, 58) comprise at least two isolation regions (282-283; 582-583, 583-584) laterally bounding the first portion (23, 53). According to another embodiment, the at least two isolation regions (282-283; 582-583, 583-584) are laterally separated by a first distance (286; 586, 587) exceeding a lateral width (365; 665, 666) of the first doped region (36, 66). According to a still another embodiment, a difference between the first distance (8621) and the lateral width (365; 665, 666) is determined at least in part by an amount (464) by which a mask (46) on the first surface (21, 51) extends laterally over the first portion (23, 53) from the at least two isolation regions (281-282; 582-583, 583-584). According to a yet another embodiment, the one or more isolation regions (28, 58) at the first surface (21, 51) comprises at least three isolation regions (582, 583, 584) and the rectifying junction (70) located in the first portion (53), comprises a first rectifying junction (701) located between a first (582) and second (583) of the at least three isolation regions (582, 583, 584) and a second rectifying junction (702) located between the second (583) and a third (584) of the at least three isolation regions (582, 583, 584). According to a still yet another embodiment, the first (701) and second (702) rectifying junctions do not extend to the at least three isolation regions (582, 583, 584).

According to a second embodiment, there is provided a method for forming a varactor diode having a first terminal (45, 75) and a second terminal (44, 74), comprising, providing a substrate comprising a semiconductor (22, 52) having a first surface (21, 51), providing a first mask (86) on the first surface with openings (87) extending to the first surface (21), forming cavities (88) under the openings (87) extending into the semiconductor (22) a first distance (887), wherein the cavities (88) have sidewalls (885) and a bottom (886), creating at least one sub-isolation buried layer (SIBL) region (26) beneath the bottom (886) and part way up the sidewalls (885) of at least one of the cavities (88), filling the cavities (88) with a dielectric to create isolation regions (28) in the cavities (88) overlying the at least one SIBL region (26), forming a varactor junction (40, 70) in the substrate (22, 52) laterally proximate but not intersecting a first isolation region (282, 283; 582, 583, 584), wherein a first side (36, 66) of the varactor junction (40, 70) is coupled to the first terminal (45, 75) and a second side (34, 64) of the varactor junction (40, 70) is coupled to the second terminal (44, 74) through the at least one SIBL region (26, 56). According to a further embodiment, the method further comprises forming a WELL region (24, 54) ohmically coupled to the second side (34, 64) of the varactor junction (40, 70). According to a still further embodiment, the method further comprises forming on a second side of the first isolation region (282, 283; 582, 583, 584) a further doped region (30, 32; 60, 62) ohmically coupled between the second terminal (44) and the at least one SIBL region (26, 56). According to a yet further embodiment, the method further comprises prior to the step of forming the varactor junction (40, 70), forming a mask (46) on the first surface (21) extending laterally inward from spaced-apart isolation regions (282, 283) by a first distance (464) thereby creating an opening in the mask (46) of a first width (465) above the first region (23), which first width (465) determines at least in part a second width (365) of the first side (36, 66) of the varactor junction (40, 70). According to a still yet further embodiment, the second width (365) is less than a third width (286; 586, 587) between the spaced-apart isolation regions (282-283; 582-583, 583-584).

According to a third embodiment, there is provided a varactor diode (20, 50) having first (45) and second (44) terminals, and comprising, a substrate (22, 52) having a first surface (21, 51), at least two isolation regions (282-283; 582-584) in the substrate (22, 52) extending to the first surface (21, 51), spaced apart by a first distance (286, 586, 587), thereby defining a first portion (23, 53) of the varactor diode (20, 50) therebetween, a buried layer region (26, 56) having a first part underlying at least one of the two isolation regions (282-283; 582-584) and coupled to the second terminal (44) of the varactor diode (20, 50), and a PN junction (40, 70) formed in the first portion (23, 53) and having a first side (36, 66) of the PN junction (40, 70) coupled to the first terminal (45) and a second side (34, 64) of the PN junction (40, 70) coupled to the buried layer region (26, 56), wherein the first side (36, 56) of the PN junction (40, 70) does not extend to the buried layer region (26, 56) or either of the at least two isolation regions (282-283; 582-584). According to a further embodiment, the buried layer region (26, 56) further comprises upwardly extending first parts (263) along sides (885) of at least one of the isolation regions (282-283; 582-584). According to a still further embodiment, the diode (20, 50) further comprises a further doped region (30, 32; 60, 62) coupling at least one of the upwardly extending first parts (263) to the second terminal (44, 74). According to a yet further embodiment, the further doped region (30, 32; 60, 62) comprises a first portion (30, 60) extending from the surface (21) at least to the upwardly extending first parts (263) and a more heavily doped second portion (32, 62) extending from the surface (21) into the first portion (30, 60). According to a still yet further embodiment, the at least two isolation regions (282-283; 582-584) comprise two pairs of isolation regions (582-583; 583-584) in the substrate (22, 52) extending to the first surface (21, 51), spaced apart by a first and second distances distance (586, 587), respectively, thereby defining two portions (531, 532) therebetween in which two varactor junctions (701, 702) are formed having first sides (661, 662) coupled to separate first terminals (751, 752) and second sides (641, 642) coupled to a second common terminal (74), wherein the two varactor junctions (701, 702) coupled to separate terminals (751, 752) are adapted to operate as differential inputs.

While at least one exemplary embodiment has been presented in the foregoing detailed description of the invention, it should be appreciated that a vast number of variations exist. For example, and not intended to be limiting, the various manufacturing stages 104-113 may be carried in other orders than those described above. For example, implants A-F may be performed in any order. Further, while it is preferred to form STI regions 28 near the beginning of the manufacturing sequence, they may be formed later in the manufacturing sequence. Persons of skill in the art will understand that certain steps, as for example, the etching of trenches 88 and providing liners 90, 91 are of necessity performed prior to filling in the dielectric to form STI regions 26, but many other steps can be performed in other orders than those illustrated and it is intended that the appended claims include such variations in the order of the described manufacturing stages. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A varactor diode having first and second terminals, and comprising:
   a substrate having a first surface;
   at least two isolation regions in the substrate extending to the first surface, spaced apart by a first distance, thereby defining a first portion of the varactor diode therebetween;
   a buried layer region having a first part underlying at least one of the two isolation regions and coupled to the second terminal of the varactor diode; and
   a PN junction formed in the first portion and having a first side of the PN junction coupled to the first terminal and a second side of the PN junction coupled to the buried layer region, wherein the first side of the PN junction does not extend to the buried layer region or either of the at least two isolation regions.

2. The varactor diode of claim 1, wherein the buried layer region further comprises upwardly extending first parts along sides of at least one of the isolation regions.

3. The varactor diode of claim 2, further comprising a further doped region coupling at least one of the upwardly extending first parts to the second terminal.

4. The varactor diode of claim 3, wherein the further doped region comprises a first portion extending from the surface at least to the upwardly extending first parts and a more heavily doped second portion extending from the surface into the first portion.

5. The varactor diode of claim 1, wherein the at least two isolation regions comprise two pairs of isolation regions in the substrate extending to the first surface, spaced apart by a first and second distances distance, respectively, thereby defining two portions therebetween in which two varactor junctions are formed having first sides coupled to separate first terminals and second sides coupled to a second common terminal, wherein the two varactor junctions coupled to separate terminals are adapted to operate as differential inputs.

6. The varactor diode of claim 1, wherein:
   the substrate has a first portion and a second portion;
   the two or more isolation regions separate the first portion and the second portion; and
   the PN junction is located in a first portion of the substrate, and the PN junction comprises a first doped region of a first conductivity type extending to the first surface and coupled to the first terminal, and a second doped region of a second, opposite, conductivity type underlying the first portion.

7. The varactor diode of claim 6, wherein:
the two or more isolation regions each have lateral sidewalls and a bottom; and
the buried layer region is of the second conductivity type and underlies the bottom and extends part way up the lateral sidewalls of an isolation region.

8. The varactor diode of claim 6, further comprising a WELL region of the second conductivity type underlying the first portion.

9. The varactor diode of claim 8, wherein the WELL region intersects the buried layer region.

10. The varactor diode of claim 6, further comprising a mask on the first surface extending laterally by a first distance onto a central portion from the two or more isolation regions and having an opening of a first width determining at least in part a lateral width of the first doped region.

11. The varactor diode of claim 6, wherein the first doped region is separated from the buried layer region by a distance exceeding a depletion width of the PN junction at maximum rated voltage.

12. The varactor diode of claim 6, wherein the two or more isolation regions laterally bound the first portion.

13. The varactor diode of claim 6, wherein the two or more isolation regions are laterally separated by a first distance exceeding a lateral width of the first doped region.

14. The varactor diode of claim 13, wherein a difference between the first distance and the lateral width is determined at least in part by an amount by which a mask on the first surface extends laterally over the first portion from the two or more isolation regions.

15. The varactor diode of claim 6, wherein the two or more isolation regions comprise at least three isolation regions and the PN junction comprises a first rectifying junction located between a first and second of the at least three isolation regions and a second rectifying junction located between the second and a third of the at least three isolation regions.

16. The varactor diode of claim 15, wherein the first and second rectifying junctions do not extend to the at least three isolation regions.

17. The varactor diode of claim 6, wherein:
the substrate has a first portion and a second portion;
the two or more isolation regions separate the first portion and the second portion;
the PN junction is located in the first portion of the substrate, and the PN junction comprises a first doped region of a first conductivity type extending to the first surface and coupled to the first terminal, and a second doped region of a second, opposite, conductivity type underlying the first portion; and
the varactor diode further comprises a further doped region of the second conductivity type, which extends to the first surface, is located in the second portion and is coupled to the second terminal.

18. The varactor diode of claim 17, wherein:
the buried layer region further comprises upwardly extending first parts along sides of at least one of the isolation regions; and
the further doped region couples at least one of the upwardly extending first parts to the second terminal.

19. The varactor diode of claim 17, wherein the buried layer region ohmically couples the second and the further doped regions without intersecting the first doped region.

* * * * *

UNITED STATES PATENT AND TRADEMARK OFFICE
CERTIFICATE OF CORRECTION

| | | |
|---|---|---|
| PATENT NO. | : 8,053,866 B2 | Page 1 of 1 |
| APPLICATION NO. | : 12/536715 | |
| DATED | : November 8, 2011 | |
| INVENTOR(S) | : Pamela J. Welch et al. | |

It is certified that error appears in the above-identified patent and that said Letters Patent is hereby corrected as shown below:

On the Title Page, item [75] Inventors: Hernan A. Reuda, delete "Reuda" and replace with "Rueda".

Signed and Sealed this
Twenty-eighth Day of August, 2012

David J. Kappos
*Director of the United States Patent and Trademark Office*